United States Patent
Yang et al.

(10) Patent No.: US 8,709,877 B2
(45) Date of Patent: Apr. 29, 2014

(54) INTEGRATED CIRCUIT PACKAGING SYSTEM WITH AN ENCAPSULATION AND METHOD OF MANUFACTURE THEREOF

(75) Inventors: DaeWook Yang, Yongin-si (KR); Yeongbeom Ko, Suwon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/495,663

(22) Filed: Jun. 13, 2012

(65) Prior Publication Data

US 2013/0334668 A1 Dec. 19, 2013

(51) Int. Cl.
*H01L 21/48* (2006.01)

(52) U.S. Cl.
USPC .................. 438/125; 257/684; 257/E33.058

(58) Field of Classification Search
USPC .......... 438/121, 124, 125, 126; 257/684, 713, 257/E33.058, E33.059
See application file for complete search history.

(56) References Cited

U.S. PATENT DOCUMENTS

| 5,674,785 | A | * | 10/1997 | Akram et al. ................... 438/15 |
| 5,936,304 | A | | 8/1999 | Lii et al. |
| 6,191,487 | B1 | | 2/2001 | Rodenbeck et al. |
| 6,338,980 | B1 | | 1/2002 | Satoh |
| 6,551,906 | B2 | | 4/2003 | Oka |
| 6,794,751 | B2 | | 9/2004 | Kumamoto |
| 7,858,420 | B2 | * | 12/2010 | Derderian et al. .............. 438/48 |
| 2008/0067667 | A1 | | 3/2008 | Mahler et al. |

\* cited by examiner

*Primary Examiner* — Quoc Hoang
(74) *Attorney, Agent, or Firm* — Ishimaru & Associates LLP

(57) ABSTRACT

A method of manufacture of an integrated circuit packaging system includes: forming an integrated circuit device having a device contact surface, a device lateral side, and a device backside opposite the device contact surface; forming a device shell, having a shell lip, contiguous with the device backside and the device lateral side, the shell lip adjacent to and coplanar with the device contact surface; attaching a substrate to the integrated circuit device, the device shell between the integrated circuit device and the substrate; and forming an encapsulation on the substrate and covering the integrated circuit device and the device shell.

20 Claims, 5 Drawing Sheets

INTEGRATED CIRCUIT PACKAGING SYSTEM WITH AN ENCAPSULATION AND METHOD OF MANUFACTURE THEREOF

TECHNICAL FIELD

The present invention relates generally to an integrated circuit packaging system, and more particularly to a system having an encapsulation.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. As the size of connections decreases and density increases, heat dissipation becomes an issue.

Thus, a need still remains for packages with increased device reliability. In view of the decreasing size of connectors, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an integrated circuit device having a device contact surface, a device lateral side, and a device backside opposite the device contact surface; forming a device shell, having a shell lip, contiguous with the device backside and the device lateral side, the shell lip adjacent to and coplanar with the device contact surface; attaching a substrate to the integrated circuit device, the device shell between the integrated circuit device and the substrate; and forming an encapsulation on the substrate and covering the integrated circuit device and the device shell.

The present invention provides an integrated circuit packaging system, including: an integrated circuit device having a device contact surface, a device lateral side, and a device backside opposite the device contact surface; a device shell, having a shell lip, contiguous with the device backside and the device lateral side, the shell lip adjacent to and coplanar with the device contact surface; a substrate attached to the integrated circuit device, the device shell between the integrated circuit device and the substrate; and an encapsulation on the substrate and covering the integrated circuit device and the device shell.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
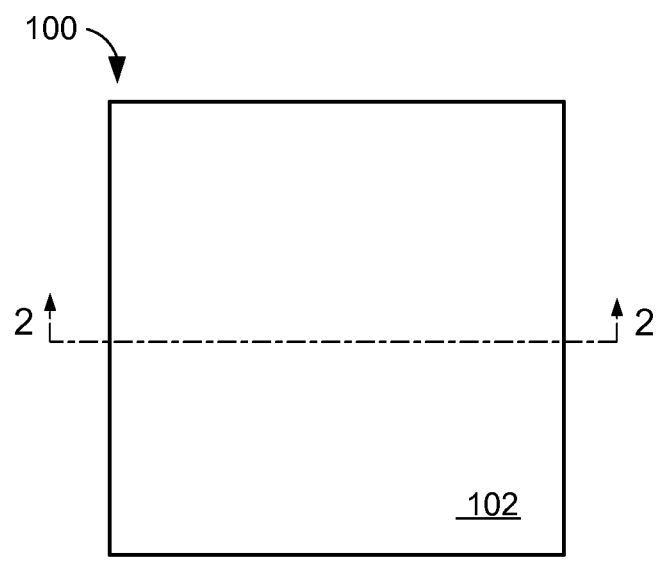
FIG. 1 is a top view of an integrated circuit packaging system in an embodiment of the present invention

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of an "active side" of the integrated circuit device, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" refers to direct contact between elements with no intervening element.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The top view depicts an encapsulation 102. The encapsulation 102 is defined as a protective cover having electrical and environmental insulating properties providing a hermetic seal. As an example, the encapsulation 102 can be a molded encapsulation material, such as an epoxy molding compound or ceramic material.

For illustrative purposes, the integrated circuit packaging system 100 is shown with the encapsulation 102 having a square geometric shape although it is understood that the encapsulation 102 can have a different geometric shape. For example, the encapsulation 102 can have a rectangular geometric shape or an octagonal geometric shape.

Figure 2:
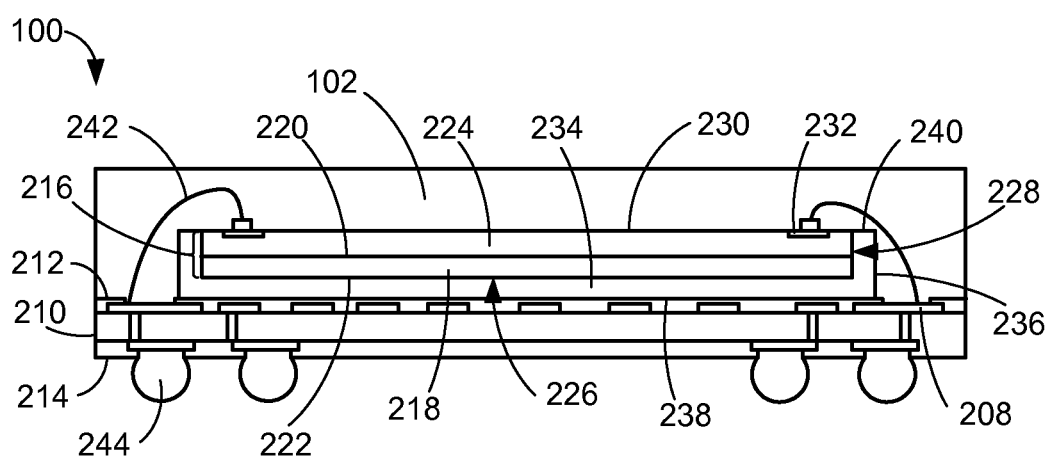
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include a substrate 210. The substrate 210 is defined as a rigid structure for mounting devices and providing interconnection. For example, the substrate 210 can be a laminated substrate, such as a printed circuit board, a silicon or semiconductor substrate, or a ceramic substrate.

The substrate 210 can have a substrate first side 212 and a substrate second side 214. The substrate second side 214 is the side of the substrate 210 that is opposite or facing away from the substrate first side 212.

The substrate 210 can have connection pads 208 exposed along the substrate first side 212 and the substrate second side 214. The connection pads 208 are for providing electrical connection to between structures and devices to the substrate 210.

An integrated circuit device 216 can be mounted on the substrate 210. The integrated circuit device 216 is defined as a semiconductor device having active circuitry therein (not shown). For example, the integrated circuit device 216 can be a semiconductor chip or a semiconductor device.

The integrated circuit device 216 can include an integrated circuit die 218. As an example, the integrated circuit die 218 can be a silicon die, a germanium die, a thin integrated circuit die, or an ultrathin integrated circuit die. The integrated circuit die 218 can have an active side 220 and a nonactive side 222.

The active side 220 is defined as a side of a die having active circuitry fabricated thereon. The active side 220 can be parallel with the substrate first side 212. As an example, the active side 220 can be formed as a part of the front-end-of-line (FEOL) process for fabricating the active circuitry (not shown). As a further example, the active side 220 can be fabricated along a surface of semiconductor die or substrate.

The active side 220 is the side facing away from the substrate first side 212. The nonactive side 222 is the side of the integrated circuit die 218 opposite the active side 220.

A device buildup structure 224 can be on the active side 220. The device buildup structure 224 is defined as one or more layers of conductive and insulating material for providing connection to active circuitry. For example, the device buildup structure 224 can include one or more metal and dielectric layers (not shown). As a further example, the device buildup structure 224 can include filled metal vias (not shown) for connection through and between layers. In yet a further example, the device buildup structure 224 can be formed as a part of the back-end-of-line (BEOL) process. The device buildup structure 224 can be on a side of the integrated circuit device 216 facing away from the substrate 210.

The device buildup structure 224 can include a device contact surface 230. The device contact surface 230 is the side or surface opposite the side of the device buildup structure 224 that is in contact with the active side 220. As an example, the device contact surface 230 can be a sealing layer or protective layer, such as a nitride or oxide layer, on one of the dielectric or conductive layers. The device contact surface 230 can be the side of the integrated circuit device 216 facing away from the substrate 210. The device contact surface 230 can be the top most or outermost layer of the device buildup structure 224.

Contact pads 232 can be exposed along the device contact surface 230. The contact pads 232 are defined as conductive pads or surfaces for providing electrical connection between a device and other devices or structures. For example, the contact pads 232 can be made from a single layer or multiple layers of conducive material, such as a metal or metal alloy.

The integrated circuit device 216 can include a device backside 226 and a device lateral side 228. The device backside 226 is the side or surface of the integrated circuit device 216 that is parallel with the active side 220, the device contact surface 230 or a combination thereof. The nonactive side 222 of the integrated circuit die 218 can be the same surface as the device backside. The device lateral side 228 is the side or surface of the integrated circuit device 216 that is vertical relative to the active side 220, the device contact surface 230 or a combination thereof. For example, the device lateral side 228 can be perpendicular to the active side 220, the device contact surface 230 or a combination thereof.

The integrated circuit device 216 can have a device shell 234 surrounding the device backside 226 and the device lateral side 228. The device shell 234 is defined as a non-conducive coating or layer surrounding a semiconductor device. For example, the device shell 234 can be formed from a non-conductive material, such as a dielectric material. For example, the dielectric material can be a metal oxide. As a further example, the device shell 234 can be a polymer material, such as an epoxy compound.

The device shell 234 can have thermal characteristics similar to that of the non-conductive layers of the device buildup structure 224. For example, the device shell 234 can have a coefficient of thermal expansion (CTE) that is the same or similar to the CTE of the non-conductive layers in the device buildup structure 224, the material used to form the device contact surface 230, or a combination thereof.

It has been discovered that the device shell 234 having a CTE similar to or the same as that of the non-conductive layers of the device buildup structure 224, the device contact surface 230, or a combination thereof improves performance and reliability of the integrated circuit packaging system 100. The similar or equivalent CTEs can improve performance and reliability of the integrated circuit device 216 by preventing delamination between the layers of the device buildup structure 224.

The device shell 234 can be contiguous with the device backside 226 and the device lateral side 228. The device shell 234 can be in direct contact with and entirely cover the device lateral side 228 and the device backside 226. The device shell 234 can seal the device buildup structure 224 exposed along the device lateral side 228.

The device shell 234 can include a shell lateral side 236 and a shell backside 238. The shell lateral side 236 can be the portion of the device shell 234 covering the device lateral side 228. The shell lateral side 236 can seal the device buildup structure 224 exposed along the device lateral side 228. The shell backside 238 can be the portion of the device shell 234 covering the device backside 226.

It has also been discovered that the device shell 234 sealing the device buildup structure 224 exposed along the device lateral side 228 improves reliability. The shell lateral side 236 bonds to the exposed layers of the device buildup structure 224 which can prevent delamination between the layers of the device buildup structure 224 which improves reliability.

The device shell 234 can include gaps, grooves, or voids in the surface of the shell lateral side 236 characteristic of a B-stage elastic separation process. The surface of the shell lateral side 236 can include an irregular surface, including peaks and valleys characteristic of a B-stage elastic separation process. The B-stage elastic separation process is a process by which a B-staged material, such as a partially cured polymer or resin, is separated by physical displacement. For example, the B-stage material between two surfaces can be split into two portions by moving the two surfaces away from each other.

The device shell 234 can include a shell lip 240. The shell lip 240 is a surface of the device shell 234 that is horizontal relative to the device lateral side 228 and adjacent to the device contact surface 230. For example, the shell lip 240 can be perpendicular to the device lateral side 228. The shell lip 240 can be coplanar with the device contact surface 230. The device shell 234 is not on or does not cover the device contact surface 230.

It has been further discovered that the shell lip 240 coplanar with the device contact surface 230 improves connectivity. The shell lip 240 coplanar with the device contact surface 230 does not cover the device contact surface 230 which eliminates the risk of the device shell 234 inadvertently covering the contact pads 232 which improves connectivity.

The device shell 234 can include a shell backside 238. The shell backside 238 is the side of the device shell 234 facing away from the device contact surface 230. The shell backside 238 can be on or in direct contact with the substrate first side 212.

Internal interconnects 242 can connect the integrated circuit device 216 and the substrate 210. The internal interconnects 242 are defined as conductive interconnect structures. For example, the internal interconnects 242 can be wire bonds, ribbon wire bonds, solder ball, solder bumps, or other electrical connectors.

The internal interconnects 242 can be attached to the contact pads 232 along the device contact surface 230 and the connection pads 208 of the substrate first side 212. The internal interconnects 242 can provide electrical connection between the integrated circuit device 216 and the substrate 210.

For illustrative purposes, the integrated circuit device 216 is shown connected to the substrate in a wirebonded configuration although it is understood that the integrated circuit device 216 can be connected to the substrate differently. For example, the integrated circuit device 216 can be connected to the substrate 210 in a flip-chip configuration with the device contact surface 230 facing the substrate first side 212.

The encapsulation 102 can be on the substrate second side 214. The encapsulation 102 can cover the integrated circuit device 216, the internal interconnects 242 and the device shell 234. The encapsulation 102 can be on and cover the device contact surface 230, the shell lip 240, and the shell lateral side 236.

External interconnects 244 can be attached to the substrate second side 214. The external interconnects 244 are defined as conductive connection structures. The external interconnects 244 can be solder balls, solder bumps, conductive bumps, conductive pillars, or conducive posts. The external interconnects 244 can connect the integrated circuit packaging system 100 to the next system level down (not shown).

Figure 3:
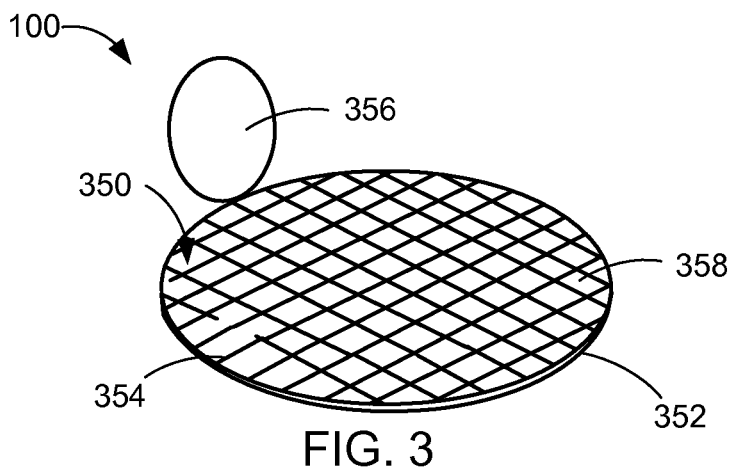
FIG. 3 is an isometric view of the integrated circuit packaging system 100 in a partial singulation phase.

Referring now to FIG. 3, therein is shown an isometric view of the integrated circuit packaging system 100 in a partial singulation phase. The isometric view depicts a wafer device side 350 of a semiconductor wafer 352. The semiconductor wafer 352 can be partially singulated along the wafer device side 350 to form a partially formed portions 358 of the integrated circuit device 216 of FIG. 2, including the integrated circuit die 218 of FIG. 2. For example, partial singulation can occur when an object, such as the semiconductor wafer 352, is not completely separated or cut by a singulation process, such as sawing. As a specific example, partial singulation of an object can be used to form a groove or channel in a surface.

The partially formed portions 358 of the integrated circuit device 216 can include active circuitry (not shown) formed on the active side 220 of FIG. 2 and the device buildup structure 224 of FIG. 2 formed on the active side 220 of the integrated circuit die 218. The device contact surface 230 of FIG. 2 can be at the wafer device side 350. The semiconductor wafer 352 can be partially singulated between instances of the active side 220 and the device buildup structure 224 for each of the partially formed portions 358 of the integrated circuit device 216.

For example, the semiconductor wafer 352 can be have grooves 354 formed between each of the partially formed portions 358 the integrated circuit device 216. The grooves 354 can be formed to a depth of the semiconductor wafer 352 that is greater than thickness of the device buildup structure 224. The grooves 354 are not formed through the entire thickness of the semiconductor wafer 352 and do not traverse from the wafer device side 350 to a side opposite of the wafer device side 350.

The grooves 354 can be formed by a number of different methods or processes. For example, the grooves 354 can be formed by a physical process, such as sawing, routing, or laser cutting, or a chemical process, such as etching. For illustrative purposes, the grooves 354 are shown being formed with a saw 356, although it is understood that the grooves 354 can be formed by any of the above mentioned processes.

Figure 4:
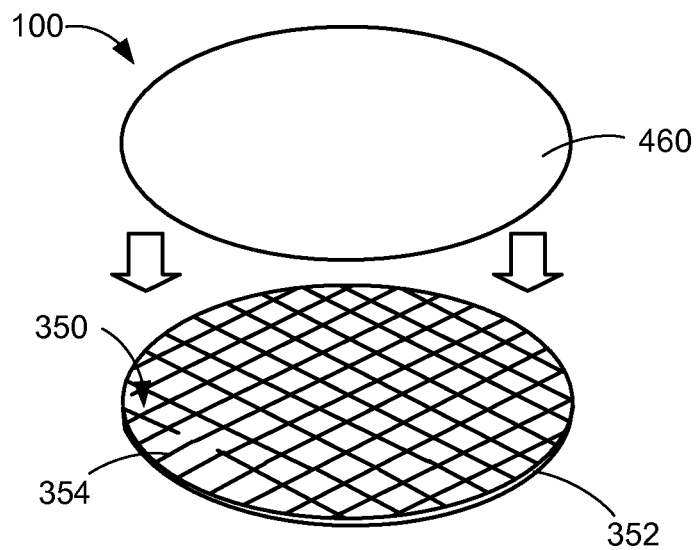
FIG. 4 is the structure of FIG. 3 in a lamination phase.

Referring now to FIG. 4, therein is shown the structure of FIG. 3 in a lamination phase. An adhesive cover 460 can be placed or formed over the wafer device side 350 of the semiconductor wafer 352. The adhesive cover 460 is defined as a protective cover having adhesive properties on a side of the cover. For example, the adhesive cover 460 can be a back-grinding tape or a coverlay tape.

The adhesive cover 460 can be on and cover the grooves 354 and the wafer device side 350. The adhesive cover 460 can provide protection for the wafer device side 350 during downstream processes, such as grinding and transportation.

Figure 5:
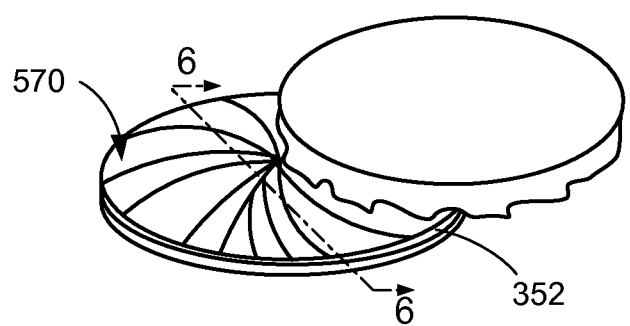
FIG. 5 is the structure of FIG. 4 in a thinning phase.

Referring now to FIG. 5, therein is shown the structure of FIG. 4 in a thinning phase. The semiconductor wafer 352 of FIG. 4 is shown undergoing a backside thinning process. The structure of FIG. 4 can be inverted to expose a wafer backside 570 of the semiconductor wafer 352. The wafer backside 570 is defined as the side of the semiconductor wafer 352 that faces away from the wafer device side 350 of FIG. 3.

The backside thinning process is a process that reduces the thickness of the semiconductor wafer 352. For example, portions of the semiconductor wafer 352 can be removed from the wafer backside 570 to reduce the thickness of the semiconductor wafer 352.

The thickness of the semiconductor wafer 352 can be reduced by a number of different processes. For example, the thickness can be reduced by physical or mechanical processes, such as grinding, or chemical processes, such as etching. For illustrative purposes, the semiconductor wafer 352 is shown undergoing the backside thinning process by grinding, although it is understood that any of the above mentioned processes may be used to reduce the thickness of the semiconductor wafer 352.

The thickness of the semiconductor wafer 352 can be reduced such that the grooves 354 of FIG. 3 traverse from the wafer device side 350 to the wafer backside 570. The backside thinning process can form the integrated circuit device 216 of FIG. 2.

Figure 6:
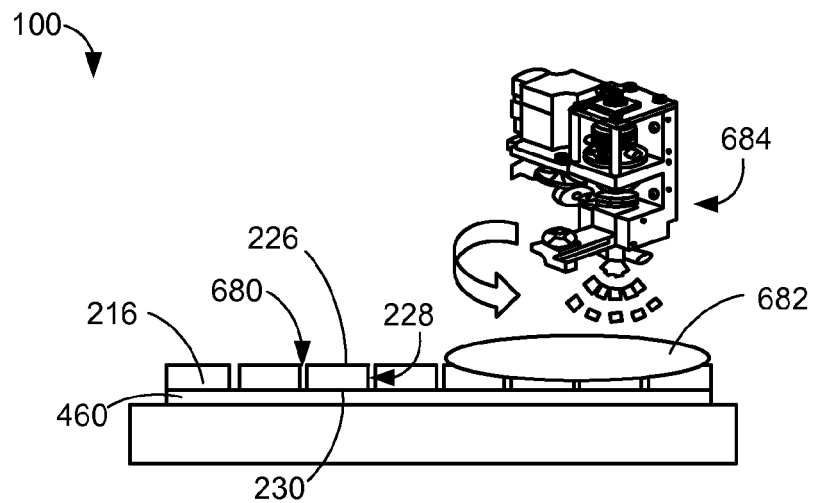
FIG. 6 is a cross-sectional view of the structure of FIG. 5 along line 6-6 in a coating phase.

Referring now to FIG. 6, therein is shown a cross-sectional view of the structure of FIG. 5 along line 6-6 in a coating phase. The cross-sectional view depicts the integrated circuit device 216 on the adhesive cover 460. A device gap 680 can be between the device lateral side 228 of one instance of the integrated circuit device 216 and the device lateral side 228 of an adjacent instance of the integrated circuit device 216.

A backside coat 682 can be applied to the device backside 226 of the integrated circuit device 216. The backside coat 682 is defined as a liquid, low viscosity, or flowable material that can undergo further processing to form a solid cover. For example, the backside coat 682 can be an uncured or liquid polymer.

The backside coat 682 can be applied on the integrated circuit device 216 by a number of different processes. For example, the backside coat 682 can be applied by a physical process, such as spin coating, physical vapor deposition, or spray coating, or a chemical process, such as chemical vapor deposition. For illustrative purposes, the backside coat 682 is shown applied with a spray coat device 684, although it is understood that the backside coat 682 can be applied by any of the above described processes.

The backside coat 682 can fill the device gap 680 and cover the device backside 226. The backside coat 682 can be the device shell 234 of FIG. 2 prior to solidification. The backside coat 682 does not cover the device contact surface 230.

Figure 7:
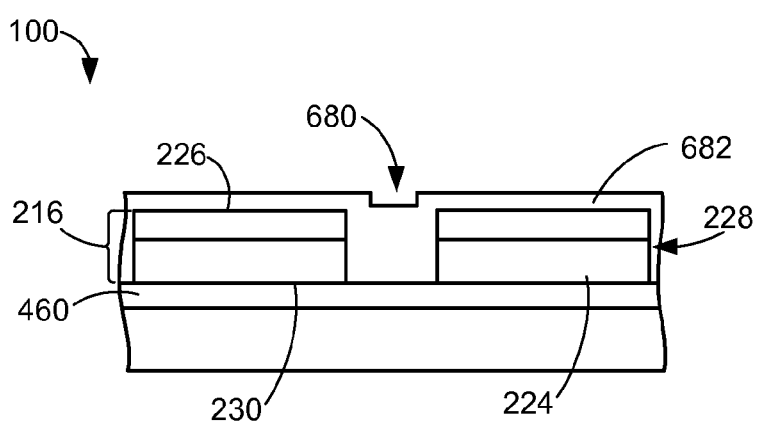
FIG. 7 is a detailed view of the structure of FIG. 6.

Referring now to FIG. 7, therein is shown a detailed view of the structure of FIG. 6. The backside coat 682 can fill the device gap 680 of FIG. 6. The backside coat 682 can completely cover the device backside 226 and the device lateral side 228 of the integrated circuit device 216. The portion of the device buildup structure 224 exposed along the device lateral side 228 is covered by the backside coat 682.

The portion or surface of the backside coat 682 in contact with the adhesive cover 460 can be coplanar with the device contact surface 230. The portion of the backside coat 682 in contact with the adhesive cover 460 can form the shell lip 240 of FIG. 2 after a separation and solidification process.

The backside coat 682 can be partially hardened or partially cured to form a low viscosity or deformable solid. For example, the backside coat 682 can be partially cured to form a B-staged resin. The backside coat 682 can be partially hardened by a number of different processes. For example, the backside coat 682 can undergo partial curing by exposure to ultraviolet (UV) light or heating.

Figure 8:
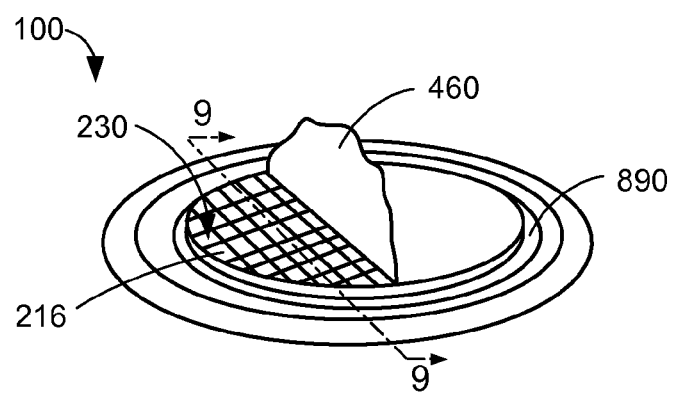
FIG. 8 is an isometric view of the structure of FIG. 6 in a peeling phase.

Referring now to FIG. 8, therein is shown an isometric view of the structure of FIG. 6 in a peeling phase. The structure of FIG. 6 can be inverted and mounted on a base film 890. The base film 890 is defined as a support film having elastic properties capable of being stretched and expanded. For example, the base film 890 can be an expandable or stretchable film capable of adhering with the backside coat 682 of FIG. 6. As a further example, the base film 890 can be a polymer film having adhesive properties controlled by degree of cure, such as the degree of polymerization and can include materials such as polyethylene terephthalate (PET) or polyvinyl chloride (PVC). The degree of cure can be controlled by, for example, exposure to UV light.

The peeling phase depicts removal of the adhesive cover 460 from the integrated circuit device 216. The adhesive cover 460 can be removed to expose the device contact surface 230 of the integrated circuit device 216.

Figure 9:
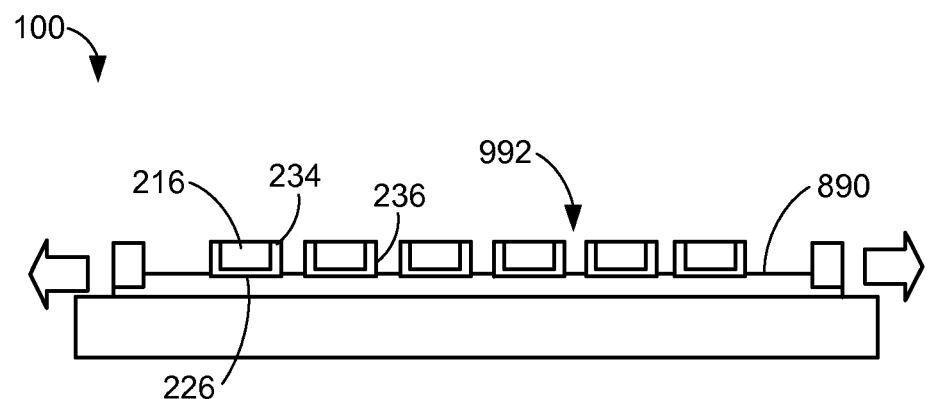
FIG. 9 is a cross-sectional view of the structure of FIG. 8 along line 9-9 in a separation phase.

Referring now to FIG. 9, therein is shown a cross-sectional view of the structure of FIG. 8 along line 9-9 in a separation phase. The cross-sectional view depicts separation or division of the backside coat 682 of FIG. 6 to form the integrated circuit device 216 and the device shell 234. Prior to separation, the backside coat 682 can be partially cured to form a B-stage material.

Separation of the backside coat 682 can be performed by a number of different processes. For example, the backside coat 682 can be separated physically to form a coat gap 992 in the backside coat 682 between instances of the integrated circuit device 216.

As a specific example, the coat gap 992 can be formed by a process such as the B-stage elastic separation process, where the base film 890 is stretched to pull each instance of the integrated circuit device 216 away from one another as depicted by the outlined arrows. The base film 890 can be stretched in a direction parallel to the device backside 226 of the integrated circuit device 216.

The separation of the backside coat 682 can form gaps, grooves, voids, or a combination thereof in the surface of the shell lateral side 236 of the device shell 234 characteristic of the B-stage elastic separation process. The surface of the shell lateral side 236 can include an irregular surface, including peaks and valleys characteristic of the B-stage elastic separation process.

Alternatively, separation of the backside coat 682 can be performed by a singulation process, such as laser cutting or sawing. The separation of the backside coat 682 can also be performed by a combination of singulation and B-stage elastic separation.

Figure 10:
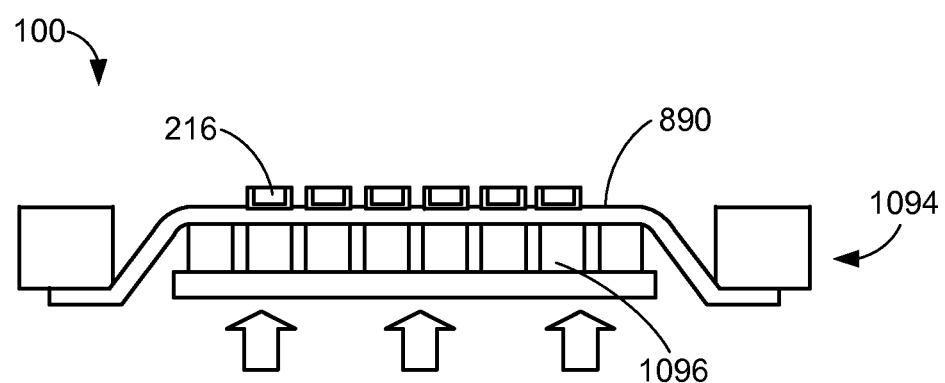
FIG. 10 is the structure of FIG. 9 in a dislodging phase.

Referring now to FIG. 10, therein is shown the structure of FIG. 9 in a dislodging phase. The dislodging phase depicts separation of the integrated circuit device 216 from the base film 890.

The integrated circuit device 216 can be removed from the base film 890 by a number of different processes. For example, the integrated circuit device 216 can be separated from the base film 890 by a physical process, such as with a dislodging structure 1094. The dislodging structure 1094 can include projections 1096, such as pins, that can be applied against the side of the base film 890 opposite the integrated circuit 216. The projections 1096 of the dislodging structure 1094 can push against the base film 890 to loosen or dislodge the integrated circuit device 216 from the base film 890.

Figure 11:
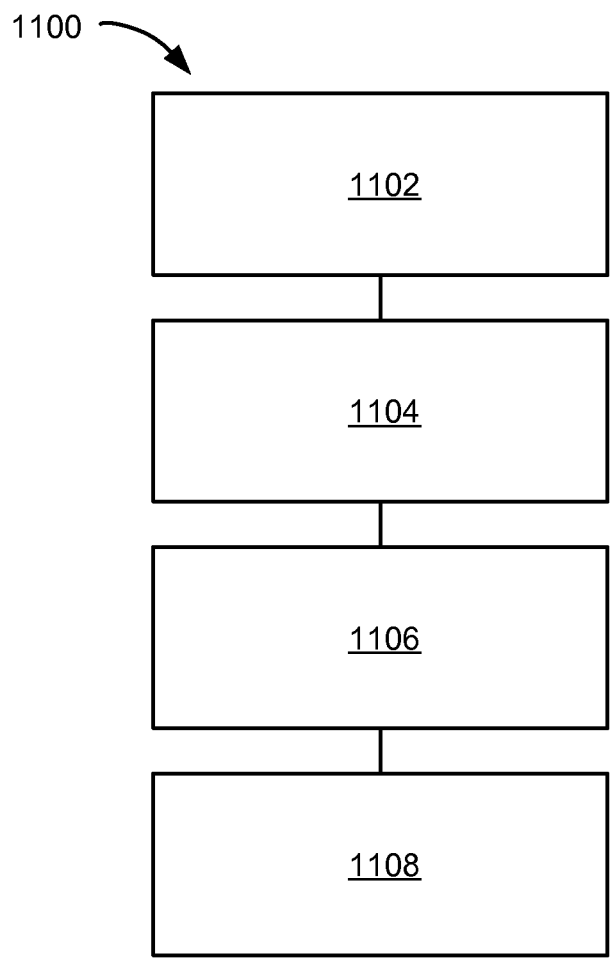
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: forming an integrated circuit device having a device contact surface, a device lateral side, and a device backside opposite the device contact surface in a block 1102; forming a device shell, having a shell lip, contiguous with the device backside and the device lateral side, the shell lip adjacent to and coplanar with the device contact surface in a block 1104; attaching a substrate to the integrated circuit device, the device shell between the integrated circuit device and the substrate in a block 1106; and forming an encapsulation on the substrate and covering the integrated circuit device and the device shell in a block 1108.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming an integrated circuit device having a device contact surface, a device lateral side, and a device backside opposite the device contact surface;
    forming a device shell, having a shell lip, contiguous with the device backside and the device lateral side, the shell lip adjacent to and coplanar with the device contact surface;
    attaching a substrate to the integrated circuit device, the device shell between the integrated circuit device and the substrate; and
    forming an encapsulation on the substrate and covering the integrated circuit device and the device shell.

2. The method as claimed in claim 1 wherein forming the device shell includes forming the device shell having a coefficient of thermal expansion similar to that of the device contact surface.

3. The method as claimed in claim 1 wherein forming the device shell includes forming a shell lateral side having grooves in the surface of the shell lateral side characteristic of an elastic separation process.

4. The method as claimed in claim 1 wherein forming the integrated circuit device includes forming a device buildup structure on a side of the integrated circuit device facing away from the substrate, the device contact surface as an outermost layer of the device buildup structure.

5. The method as claimed in claim 1 wherein forming the integrated circuit device includes forming an integrated circuit die having an active side facing away from the substrate.

6. A method of manufacture of an integrated circuit packaging system comprising:
    forming an integrated circuit device having a device contact surface, a device lateral side, and a device backside opposite the device contact surface;
    forming a device shell, having a shell lip, contiguous with the device backside and the device lateral side, the shell lip adjacent to and coplanar with the device contact surface;
    attaching a substrate, having a substrate first side and a substrate second side facing away from the substrate first side, to the integrated circuit device, the device shell between the integrated circuit device and the substrate; and
    forming an encapsulation on the substrate first side and covering the integrated circuit device and the device shell.

7. The method as claimed in claim 6 wherein forming the integrated circuit device includes:
    forming an integrated circuit die having an active side; and
    forming a device buildup structure on the active side.

8. The method as claimed in claim 6 wherein forming the encapsulation includes forming the encapsulation on the substrate first side.

9. The method as claimed in claim 6 further comprising connecting an internal interconnect between the device contact surface and the substrate first side.

10. The method as claimed in claim 6 further comprising attaching an external interconnect to the substrate second side.

11. An integrated circuit packaging system comprising:
    an integrated circuit device having a device contact surface, a device lateral side, and a device backside opposite the device contact surface;
    a device shell, having a shell lip, contiguous with the device backside and the device lateral side, the shell lip adjacent to and coplanar with the device contact surface;
    a substrate attached to the integrated circuit device, the device shell between the integrated circuit device and the substrate; and
    an encapsulation on the substrate and covering the integrated circuit device and the device shell.

12. The system as claimed in claim 11 wherein the device shell has a coefficient of thermal expansion similar to that of the device contact surface.

13. The system as claimed in claim 11 wherein the device shell includes a shell lateral side having grooves in the surface of the shell lateral side characteristic of an elastic separation process.

14. The system as claimed in claim 11 wherein the integrated circuit device includes a device buildup structure on a side of the integrated circuit device facing away from the substrate, the device contact surface as an outermost layer of the device buildup structure.

15. The system as claimed in claim 11 wherein the integrated circuit device includes an integrated circuit die having an active side facing away from the substrate.

16. The system as claimed in claim 11 wherein the substrate includes a substrate first side and a substrate second side, the substrate second side facing away from the substrate first side and the integrated circuit device mounted on the substrate first side.

17. The system as claimed in claim 16 wherein the integrated circuit device includes:
    an integrated circuit die having an active side; and
    a device buildup structure on the active side.

18. The system as claimed in claim 16 the encapsulation is on the substrate first side.

19. The system as claimed in claim 16 further comprising an internal interconnect connected between the device contact surface and the substrate first side.

20. The system as claimed in claim 16 further comprising an external interconnect attached to the substrate second side.

* * * * *